(12) United States Patent
Im (10) Patent No.: US 11,966,127 B2
(45) Date of Patent: Apr. 23, 2024

(54) DISPLAY DEVICE

(71) Applicant: Samsung Display Co., Ltd., Yongin-Si (KR)

(72) Inventor: Minhyuk Im, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 333 days.

(21) Appl. No.: 17/391,087

(22) Filed: Aug. 2, 2021

(65) Prior Publication Data
US 2022/0181424 A1    Jun. 9, 2022

(30) Foreign Application Priority Data
Dec. 8, 2020   (KR) .......................... 10-2020-0170602

(51) Int. Cl.
*G02F 1/1345*     (2006.01)
*G01L 1/22*       (2006.01)
*H10K 59/131*     (2023.01)

(52) U.S. Cl.
CPC ........ *G02F 1/1345* (2013.01); *G02F 1/13452* (2013.01); *G02F 1/13454* (2013.01); *G01L 1/22* (2013.01); *H10K 59/131* (2023.02)

(58) Field of Classification Search
None
See application file for complete search history.

(56) References Cited

U.S. PATENT DOCUMENTS

| 7,096,748 B2 | 8/2006 | Kutlu | |
| 2016/0093685 A1* | 3/2016 | Kwon | H10K 77/111 257/40 |
| 2021/0118343 A1* | 4/2021 | Im | G02F 1/1345 |

FOREIGN PATENT DOCUMENTS

| KR | 10-2020-0027598 A | 3/2020 |
| KR | 10-2021-0048003 A | 5/2021 |

* cited by examiner

*Primary Examiner* — Dung T Nguyen
(74) *Attorney, Agent, or Firm* — Innovation Counsel LLP (57) ABSTRACT

A display device includes a substrate including a display area and a non-display area surround the display area, the non-display area including a pad area, a bending area disposed between the display area and the pad area, and a surrounding area disposed between the pad area and the bending area, a fan-out part disposed on the non-display area on the substrate and including a plurality of conductive lines that connects signal lines in the display area and pads in the pad area, and a strain gauge disposed on the substrate in the surrounding area.

19 Claims, 10 Drawing Sheets

DISPLAY DEVICE

CROSS-REFERENCE TO RELATED APPLICATION(S)

This application claims priority to and the benefit of Korean Patent Application No. 10-2020-0170602, filed on Dec. 8, 2020, which is hereby incorporated by reference for all purposes as if fully set forth herein.

BACKGROUND

1. Field

Implementations of the inventive concept relate generally to a display device. More specifically, the inventive concept relates to a display device with improved reliability.

2. Discussion of the Background

The field of display that visually expresses various electrical signals is rapidly developing. Accordingly, various flat panel display devices having excellent characteristics such as reduction in thickness, weight, and low power consumption have been introduced. In addition, recently, a display device in which a physical button or the like is removed from a front of the display device and a display area in which an image is displayed is expanded has been introduced.

Meanwhile, in order to operate the display device, a display driver IC is used. The display driver IC controls pixels by transmitting signal to a thin film transistor. When an impact applied to the vicinity (referred to as a surrounding area) of the driving circuit, a defect may occur in the display device.

The above information disclosed in this Background section is only for understanding of the background of the inventive concepts, and, therefore, it may contain information that does not constitute prior art.

SUMMARY

Some embodiments provide a display device with improved reliability.

A display device may include a substrate including a display area and a non-display area surrounding the display area, the non-display area including a pad area, a bending area disposed between the display area and the pad area, and a surrounding area disposed between the pad area and the bending area, a fan-out part disposed on the non-display area on the substrate and including a plurality of conductive lines that connects signal lines in the display area and pads in the pad area, and a strain gauge disposed on the substrate in the surrounding area.

According to an embodiment, the display device may further include a voltage line disposed on the substrate and including a main portion disposed between the display area and the bending area and a connection portion extending from the main portion toward the pad area and crossing the bending area.

According to an embodiment, the connection portion may be disposed on a same layer as the strain gauge.

According to an embodiment, the fan-out part may include a first fan-out part and a second fan-out part spaced apart from each other and disposed in the surrounding area. The first fan-out part may be disposed in a center of the surrounding area. The second fan-out part may be disposed in a side of the surrounding area. The connection portion may be disposed between the first fan-out part and the second fan-out part in the bending area.

According to an embodiment, the strain gauge may be disposed in the first fan-out part.

According to an embodiment, the strain gauge may extend along a direction parallel to the connection portion.

According to an embodiment, the display device may further include a strain gauge disposed in the second fan-out part. The strain gauge in the second fan-out part may extend along a direction perpendicular to the connection portion.

According to an embodiment, the strain gauge may be disposed in the second fan-out part.

According to an embodiment, the strain gauge may extend in a direction parallel to the main portion.

According to an embodiment, each of the conductive lines may include a first conductive layer disposed between the display area and the bending area, a second conductive layer disposed in the surrounding area, and a connection conductive layer electrically connecting the first conductive layer and the second conductive layer and crossing the bending area. The connection conductive layer may include a first connection conductive layer and a second connection conductive layer that may be connected in parallel to each other and overlap each other in a plan view.

According to an embodiment, the first conductive layer and the second conductive layer may be disposed on a same layer, and the connection conductive layer may be disposed on a different layer from the first conductive layer.

According to an embodiment, the second connection conductive layer may be disposed on the first connection conductive layer. The second connection conductive layer may be disposed on a same layer as the strain gauge.

According to an embodiment, a plurality of pixel circuits, a plurality of light emitting elements electrically connected to the pixel circuits, and a plurality of data lines electrically connected to the pixel circuits may be disposed in the display area. The conductive lines may be electrically connected to the data lines to transmit an electrical signal supplied from a driving circuit disposed in the pad area to the data lines. The first connection conductive layer may be disposed on a same layer as the data lines.

According to an embodiment, the display device may further include a plurality of driving voltage supply lines which provide a plurality of driving signals to the pixel circuits in the display area. The strain gauge may be disposed on a same layer as the driving voltage supply lines.

According to an embodiment, the strain gauge and the driving voltage supply lines may include a same material.

According to an embodiment, the strain gauge may include a resistance line which reciprocates a predetermined distance a plurality of times. The resistance line may be electrically connected to a driving circuit disposed in the pad area.

According to an embodiment, the strain gauge may detect a strain generated when stress is applied to the surrounding area.

A display device may include a substrate including a display area and a non-display area surrounding the display area, the non-display area including a pad area, a bending area disposed between the display area and the pad area, and a surrounding area disposed between the pad area and the bending area, a fan-out part disposed on the non-display area on the substrate and including a first fan-out part disposed in a center of the surrounding area and a second fan-out part disposed in a side of the surrounding area, and a strain gauge including a first strain gauge disposed in the first fan-out part and a second strain gauge disposed in the second fan-out part.

According to an embodiment, the first strain gauge and the second strain gauge may be disposed on a same layer.

According to an embodiment, the first strain gauge may extend from the surrounding area toward the bending area. The second strain gauge may extend in a direction perpendicular to the first strain gauge.

Therefore, by accurately measuring the strain generated in the surrounding area of the display device, the probability of defect occurring in the surrounding area may be predicted. Accordingly, the reliability of the display device may be improved.

It is to be understood that both the foregoing general description and the following detailed description are examples which are intended to provide further explanation of the inventive concept as claimed.

BRIEF DESCRIPTION OF THE DRAWINGS

The accompanying drawings, which are included to provide a further understanding of the inventive concept and are incorporated in and constitute a part of this specification, illustrate embodiments of the inventive concept, and together with the description serve to explain the inventive concepts.

DETAILED DESCRIPTION

Illustrative, non-limiting embodiments will be more clearly understood from the following detailed description in conjunction with the accompanying drawings.

Figure 1:
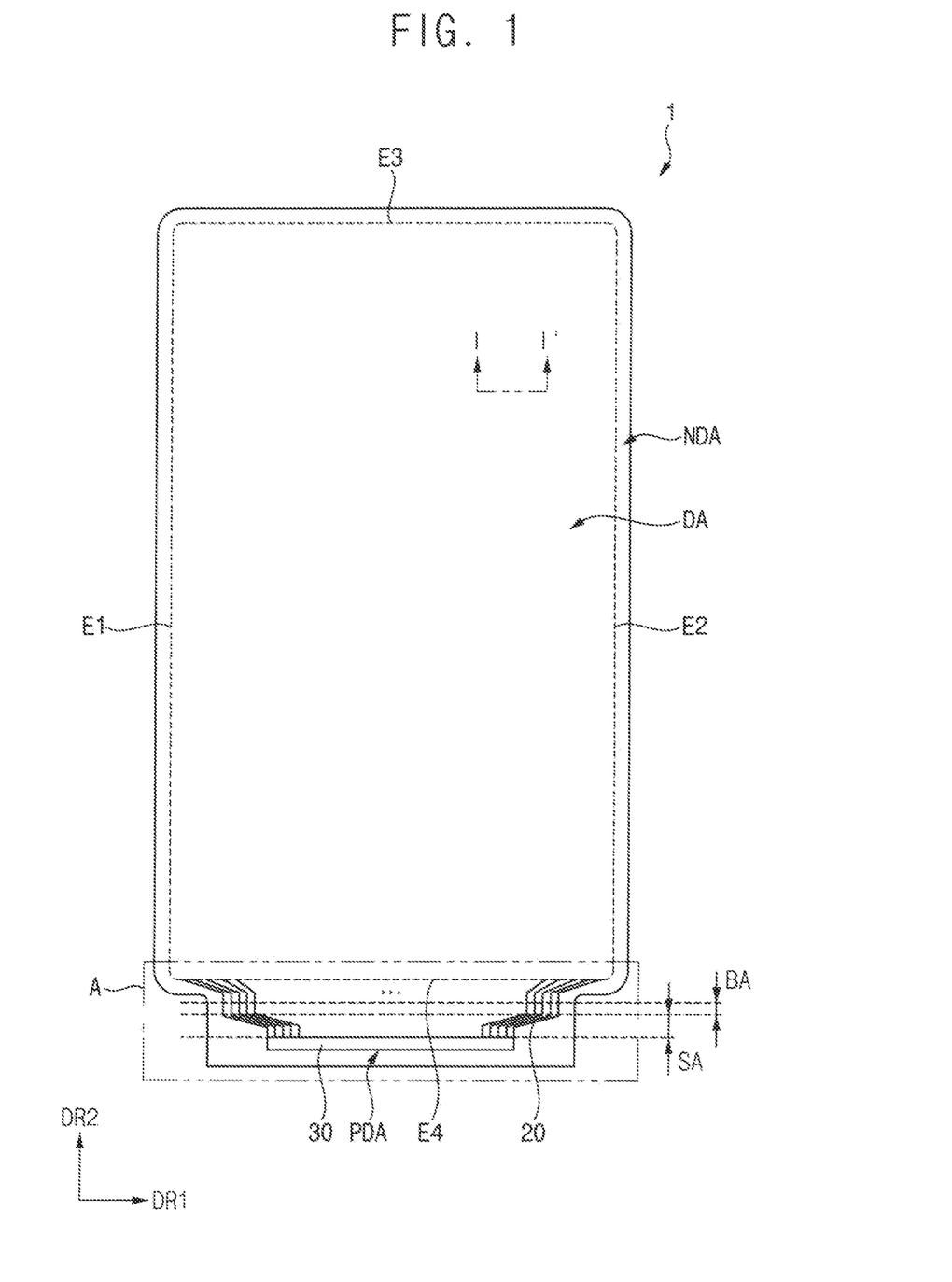
FIG. 1 is a plan view illustrating a display device according to embodiments.
Figure 2:
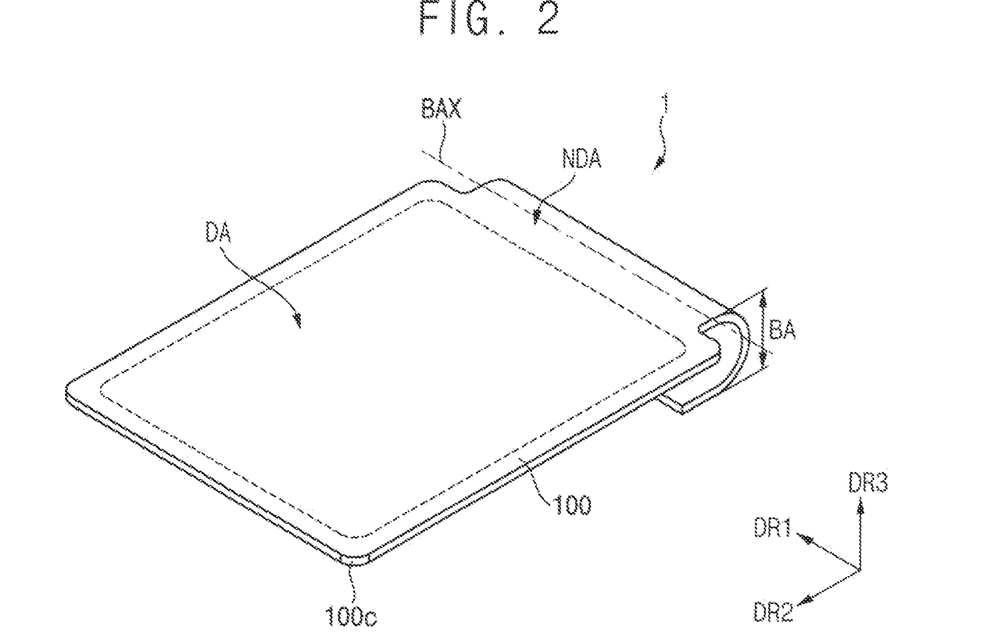
FIG. 2 is a perspective view illustrating a bending shape of the display device of FIG. 1.

FIG. 1 is a plan view illustrating a display device 1 according to embodiments. FIG. 2 is a perspective view illustrating a bending shape of the display device 1 of FIG. 1.

Referring to FIGS. 1 and 2, a display device 1 according to an embodiment of the inventive concept may include a display area DA in which a plurality of pixels are disposed and a non-display area NDA disposed outside the display area DA to surround the display area DA. The non-display area NDA may include a pad area PDA disposed at one side E4 of the display area DA, a bending area BA disposed between the display area DA and the pad area PDA, and a surrounding area SA disposed between the pad area PDA and the bending area BA. That is, the pad area PDA, the bending area BA, and the surrounding area SA may be disposed in the non-display area NDA. Various electronic devices such as a display driver IC or a printed circuit board may be electrically attached to the pad area PDA. The display area DA and the non-display area NDA including the pad area PDA, the bending area BA, and the surrounding area SA may be defined on a substrate 100. In other words, the substrate 100 may have the display to area DA and the non-display area NDA including the pad area PDA, the bending area BA, and the surrounding area SA.

The bending area BA may be bent along a bending axis BAX extending along a first direction DR1. In this case, a bending direction may be set such that the pad area PDA is disposed behind the display area DA. Accordingly, an area of the non-display area NDA recognized by a user may be minimized.

The substrate 100 may include various material having a flexible, bendable, or rollable characteristic. For example, the substrate 100 may include a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. In addition, the substrate 100 may have a multilayer structure including two layers including the polymer resin and a barrier layer including an inorganic material (e.g. silicon oxide, silicon nitride, silicon oxynitride) interposed between the two layers.

In the substrate 100, a width of the non-display area NDA including the bending area BA along the first direction DR1 is smaller than a width of the display area DA along the first direction DR1. In addition, a corner portion 100c of an edge of the substrate 100 may have a round shape. The display area DA may also have a round shape.

For example, the display area DA may include a first edge E1 and a second edge E2 facing each other, and a third edge E3 and a fourth edge E4 facing each other. When the first to fourth edges E1, E2, E3, and E4 form a substantially rectangular shape as a whole, corners formed by the first to fourth edges E1, E2, E3, and E4 may have the round shape. Also, the display area DA may have a round shape in areas other than corners.

The surrounding area SA may be disposed adjacent to the fourth edge E4. A fan-out part 20 may be disposed on the substrate 100 and may include a plurality of conductive lines connecting signal lines in the display area DA and pads in the pad area PDA. The fan-out part 20 may be disposed in the surrounding area SA.

The conductive lines may cross the bending area BA. One side of each of the conductive lines may be electrically connected to a signal line connected to a pixel circuit in the display area DA. The other side of each of the conductive lines may be electrically connected to a pad connected to a driving circuit 30 including various electronic devices such as the display driver IC.

Figure 3:
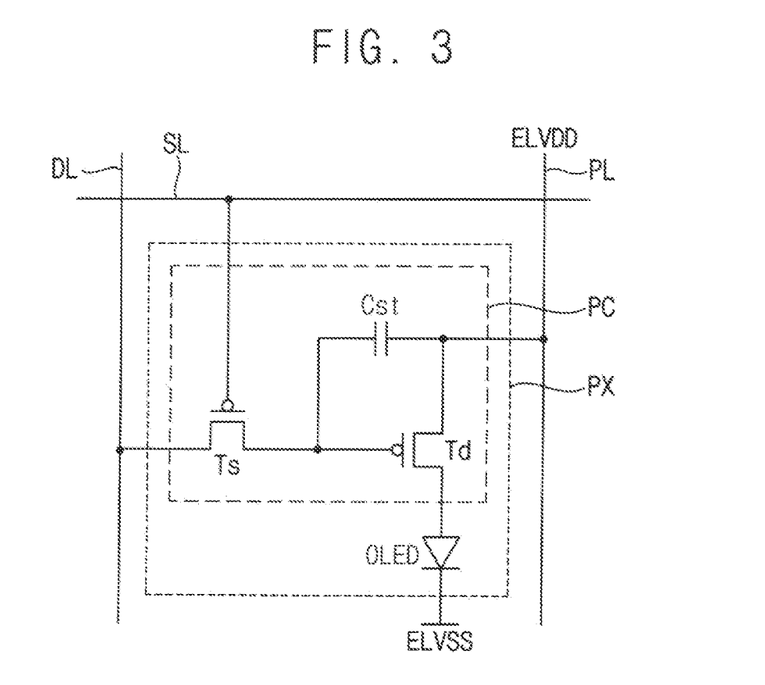
FIG. 3 is an equivalent circuit diagram of one pixel of the display device of FIG. 1.
Figure 4:
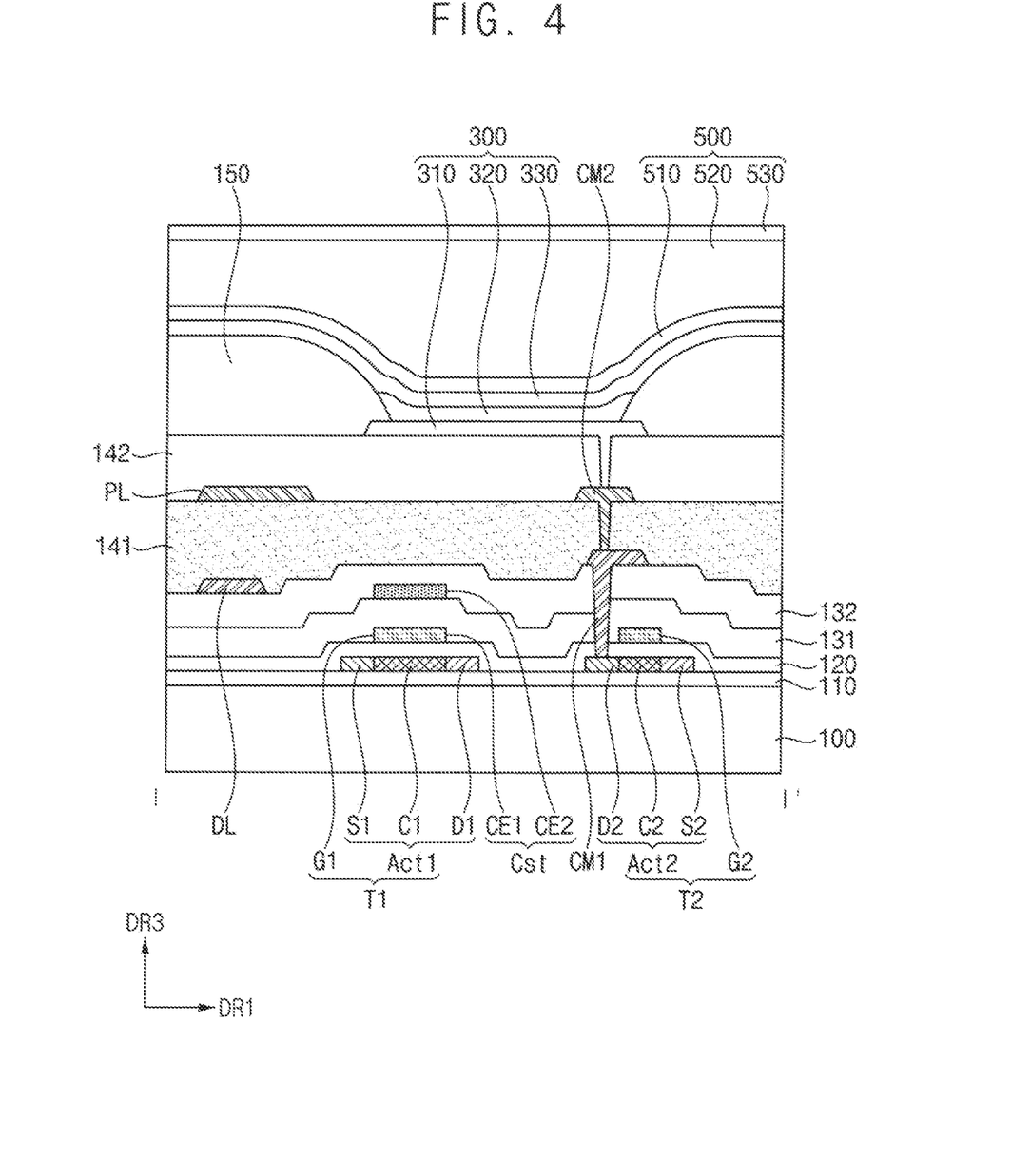
FIG. 4 is a cross-sectional view taken along line I-I' of FIG. 1.

FIG. 3 is an equivalent circuit diagram of one pixel PX of the display device 1 of FIG. 1. FIG. 4 is a cross-sectional view taken along line I-I' of FIG. 1.

Referring to FIG. 3, one pixel PX may include the pixel circuit PC connected to a scan line SL a data line DL, a driving voltage supply line PL and a light emitting element. The light emitting element may be an organic light emitting device OLED.

The pixel circuit PC may include a driving thin film transistor Td, a switching thin film transistor Ts, and a storage capacitor Cst.

The switching thin film transistor Ts may be connected to the scan line SL and the data line DL. The switching thin film transistor Ts may transmit a data signal input through the data line DL to the driving thin film transistor Td according to a scan signal input through the scan line SL.

The storage capacitor Cst may be connected to the switching thin film transistor Ts and a driving voltage supply line PL. The storage capacitor Cst may store a voltage corresponding to a difference between a voltage received from the switching thin film transistor Ts and a driving voltage ELVDD supplied to the driving voltage supply line PL.

The driving thin film transistor Td may be connected to the driving voltage supply line PL, the storage capacitor Cst and the organic light emitting device OLED. The driving thin film transistor Td may control a driving current flowing through the organic light emitting device OLED from the driving voltage supply line PL in response to a voltage value stored in the storage capacitor Cst. The organic light emitting device OLED may emit light having a is predetermined luminance according to the driving current. For example, the organic light emitting device OLED may emit red, green, blue, or white light.

Meanwhile, a case where the one pixel PX includes two thin film transistors Ts and Td and the one storage capacitor Cst is described in FIG. 3, but the inventive concept is not limited thereto. In other embodiment, the pixel circuit PC may include three or more thin film transistors or include two or more storage capacitors.

Hereinafter, a structure of the display device 1 is described in more detail with reference to FIG. 4.

Referring to FIG. 4, the light emitting element 300 may be electrically connected to a first thin film transistor T1 and a second thin film transistor T2, and the storage capacitor Cst. The light emitting element 300, the first thin film transistor T1, the second thin film transistor T2, and the storage capacitor Cst may correspond to the organic light emitting device OLED, the driving thin film transistor Td, the switching thin film transistor Ts, and the storage capacitor Cst of FIG. 3, respectively.

The first thin film transistor T1 may include a first semiconductor layer Act1 and a first gate electrode G1, and the second thin film transistor T2 may include a second semiconductor layer Act2 and a second gate electrode G2.

The first semiconductor layer Act1 and the second semiconductor layer Act2 may include amorphous silicon, polycrystalline silicon, oxide semiconductor, or organic semiconductor material. The first semiconductor layer Act1 may include a first channel region C1 and a first source region S1 and a first drain region D1 disposed on both sides of the first channel region C1. The second semiconductor layer Act2 may include a second channel region C2 and a second source region S2 and a second drain region D2 disposed on both sides of the second channel region C2.

The first and second source regions S1 and S2 of the first and second semiconductor layers Act1 and Act2 may correspond to source electrodes of the first and second thin film transistors T1 and T2, respectively. The first and second drain regions D1 and D2 of the first and second semiconductor layers Act1 and Act2 may correspond to drain electrodes of the first and second thin film transistors T1 and T2, respectively.

A gate insulating layer 120 may be disposed on the first semiconductor layer Act1 and the second semiconductor layer Act2. The first gate electrode G1 may be disposed on the gate insulating layer 120 and may overlap the first channel region C1 of the first semiconductor layer Act1. The second gate electrode G2 may be disposed on the gate insulating layer 120 and may overlap the second channel region C2 of the second semiconductor layer Act2. The first and second gate electrodes G1 and G2 may be a single film or a multilayer film made of a conductive material including at least one of molybdenum(Mo), aluminum(Al), copper (Cu), and titanium(Ti).

Although FIG. 4 illustrates that the first gate electrode G1 and the second gate electrode G2 are disposed on a same layer, the inventive concept is not limited thereto. In another embodiment, the first gate electrode G1 and the second gate electrode G2 may be disposed on different layers. In addition, the first thin film transistor T1 and the second thin film transistor T2 transistors are top gate transistors in which the first gate electrode G1 and the second gate electrode G2 are disposed on the first semiconductor layer Act1 and the second semiconductor Act2 in FIG. 4, but the inventive concept is not limited thereto. In another embodiment, the first thin film transistor T1 and the second thin film transistor T2 transistors may be a bottom gate transistors in which the first gate electrode G1 and the second gate electrode G2 are disposed under the first semiconductor Act1 and the second semiconductor Act2.

The storage capacitor Cst may include a first storage electrode CE1 and a second storage electrode CE2 overlapping each other. The first and second storage electrodes CE1 and CE2 may include a low-resistance conductive material. Examples of the low-resistance conductive material include molybdenum (Mo), aluminum (Al), copper (Co), and titanium (Ti). These may be used alone or in combination with each other.

The storage capacitor Cst may overlap the first thin film transistor T1, and the first thin film transistor T1 may be the driving thin film transistor Td. The storage capacitor Cst may be disposed to overlap the first thin film transistor T1. The first gate electrode G1 of the first thin film transistor T1 may be the first storage electrode CE1 of the storage capacitor Cst as disclosed in FIGS. 3 and 4, but the inventive concept is not limited thereto. In another embodiment, the storage capacitor Cst may be disposed not to overlap with the first thin film transistor T1 and not to share the gate electrode of the first thin film transistor T1 and the first storage electrode CE1 of the storage capacitor Cst.

A buffer layer 110 may be disposed between the substrate 100 and the first and second thin film transistors T1 and T2. The buffer layer 110 may include an inorganic insulating material. For example, the buffer layer 110 may be a single layer or a multilayer including at least one of silicon oxynitride (SiON), silicon oxide ($SiO_x$), and silicon nitride ($SiN_x$).

The gate insulating layer 120 may be disposed between the first gate electrode G1 and the first semiconductor layer Act1, and the gate insulating layer 120 may be disposed between the second gate electrode G2 and the second semiconductor layer Act2. The gate insulating layer 120 may include an inorganic insulating material. For example, the gate is insulating layer 120 may be a single layer or a multilayer including at least one of silicon oxynitride (SiON), silicon oxide ($SiO_x$), and silicon nitride ($SiN_x$).

The first and second thin film transistors T1 and T2 may be covered with a first interlayer insulating layer 131. The first and second thin film transistors T1 and T2 may be covered with a second interlayer insulating layer 132. The second interlayer insulating layer 132 may be disposed on the first interlayer insulating layer 131. The first interlayer insulating layer 131 may be disposed directly above the first and second thin film transistors T1 and T2 and/or directly above the first storage electrode CE1. The second interlayer insulating layer 132 may be disposed on the second storage electrode CE2. The first and second interlayer insulating layers 131 and 132 may be a single layer or a multilayer including at least one of silicon oxynitride (SiON), silicon oxide ($SiO_x$), and silicon nitride ($SiN_x$), respectively. In an embodiment, the first interlayer insulating layer 131 may be a single layer of silicon nitride ($SiN_x$), and the second interlayer insulating layer 132 may be a multilayer of silicon nitride ($SiN_x$) and silicon oxide ($SiO_x$).

The date line DL may be disposed on the second interlayer insulating layer 132. The date line DL may be electrically connected to the first thin film transistor T1 to provide the data signal. The date line DL may be a single layer or a multilayer including at least one of aluminum (Al), copper (Cu), titanium (Ti), and alloys thereof. In an embodiment, the date line DL may be a three-layer film of Ti/Al/Ti.

The driving voltage supply line PL may provide a driving signal to the second thin film transistor T2. The driving voltage supply line PL may be disposed on a different layer from the date line DL. In the specification, "A and B are disposed on a different layer" means that at least one insulating layer is interposed between A and B, so that one of A and B is disposed under at least one insulating layer, and the other is disposed on at least one insulating layer. A first planarization insulating layer 141 may be disposed between the driving voltage supply line PL and the date line DL.

The driving voltage supply line PL may be a single layer or a multilayer including at least one of aluminum (Al), copper (Cu), titanium (Ti), and alloys thereof. In an embodiment, the driving voltage supply line PL may be a three-layer film of Ti/Al/Ti. The driving voltage supply line PL may be disposed on the planarization insulating layer 141 in FIG. 4, but the inventive concept is not limited thereto. In another embodiment, the driving voltage supply line PL may be connected to a lower additional voltage line formed together with the date line DL through a via hole formed in the first planarization insulating layer 141 to reduce resistance.

A second planarization insulating layer 142 may cover the driving voltage supply line PL. The first and second planarization insulating layers 141 and 142 may include an organic material. The organic material may include general-purpose polymers such as imide-based polymers, polymethylmethacrylate (PMMA) or polystylene (PS), polymer derivatives having phenolic groups, acrylic polymers, arylether polymers, amide polymers, fluorine polymers, p-xylene polymers, vinyl alcohol-based polymers, and blends thereof.

The light emitting element 300 may be disposed on the second planarization insulating layer 142. The light emitting element 300 may include a pixel electrode 310, a common electrode 330, and an intermediate layer 320 disposed between the pixel electrode 310 and the common electrode 330. The intermediate layer 320 may include a light emitting layer.

A pixel defining layer 150 may be disposed on the pixel electrode 310. The pixel defining layer 150 may have openings corresponding to each of the pixels. That is, by having an opening through which at least the central portion of the pixel electrode 310 is exposed, the pixel may be defined. In addition, by increasing the distance between an edge of the pixel electrode 310 and the common electrode 330 in the pixel defining layer 150, it is possible to prevent an arc or the like from occurring between the pixel electrode 310 and the common electrode 330. The pixel defining layer 150 may be formed of an organic material such as polyimide or hexamethyldisiloxane (HMDSO).

The pixel electrode 310 may be electrically connected to the pixel circuit PC through a first connection metal CM1 and a second connection metal CM2. In other words, the pixel electrode 310 may be electrically connected to the pixel circuit PC including the first and second thin film transistors T1 and T2, and the storage capacitor Cst.

The intermediate layer 320 may include a low-molecular or high-molecular weight material. When including the low molecular weight material, the intermediate layer 320 may have a structure including at least one of a hole injection layer, a hole transport layer, an emission layer, an electron transport layer, and an electron injection layer. The intermediate layer 320 may include various organic materials including copper phthalocyanine (CuPc), N,N-di(naphthalene-1-yl)-N,N'-diphenyl-benzidine (NPB), tris-8-hydroxyquinoline aluminum (Alq3). The hole injection layer, the hole transport layer, the light-emitting layer, the electron transport layer, and the electron injection layer may be formed by a vacuum deposition method.

When the intermediate layer 320 includes the high-molecular weight material, it may have a structure including a hole transport layer and an emission layer. In this case, the hole transport layer may include poly(3,4-ethylenedioxythiophene) polystyrene sulfonate (PEDOT), and the emission layer may include a poly-phenylenevinylene (PPV)-based polymer or a fluorine-based polymer. The structure of the intermediate layer 320 is not limited to those described above, and may have various structures. For example, the intermediate layer 320 may is include an integral layer over the plurality of pixel electrodes 310, or may include a layer patterned to correspond to each of the plurality of pixel electrodes 310.

The common electrode 330 may be disposed to cover the display area DA. That is, the common electrode 330 may be integrally formed to cover the plurality of light emitting elements 300.

An encapsulation layer 500 may be disposed on the common electrode 330. The encapsulation layer 500 may protect the light emitting element 300 from moisture or oxygen from the outside. The encapsulation layer 500 may be disposed in the display area DA where the light emitting element 300 is disposed. The encapsulation layer 500 may extend from the display area DA to the surrounding area SA. The encapsulation layer 500 may include a first inorganic encapsulation layer 510, an organic encapsulation layer 520, and a second inorganic encapsulation layer 530 sequentially stacked.

The first inorganic encapsulation layer 510 may be disposed on the common electrode 330. Examples of the first inorganic encapsulation layer 510 include silicon nitride and silicon oxynitride. The first inorganic encapsulation layer 510 may be formed along the common electrode 330.

The organic encapsulation layer 520 may be disposed on the first inorganic encapsulation layer 510. The organic encapsulation layer 520 may have a sufficient thickness to and an upper surface of the organic encapsulation layer 520 may be substantially flat. The organic encapsulation layer 520 may include at least one selected from the group consisting of polyethylene terephthalate, polyethylene naphthalate, polycarbonate, polyimide, polyethylene sulfonate, polyoxymethylene, polyarylate, and hexamethyldisiloxane. These may be used alone or in combination with each other.

The second inorganic encapsulation layer 530 may cover the organic encapsulation layer 520 and may include silicon oxide, silicon nitride, and silicon oxynitride. The first and the second inorganic encapsulation layers 510 and 530 may have a larger area than the organic encapsulation layer 520. The first and the second inorganic encapsulation layers 510 and 530 may contact each other directly in an area surround the organic encapsulation layer 520. The organic encapsulation layer 520 may not be exposed to the outside due to the first and the second inorganic encapsulation layers 510 and 530 surrounding the organic encapsulation layer 520. Even if cracks occur in the encapsulation layer 500, it is possible to prevent the cracks from being connected between the first inorganic encapsulation layer 510 and the organic encapsulation layer 520 and/or between the organic encapsulation layer 520 and the second inorganic encapsulation layer 530. Accordingly, it is possible to prevent or minimize the penetration of moisture or oxygen from the outside into the display area DA.

Figure 5:
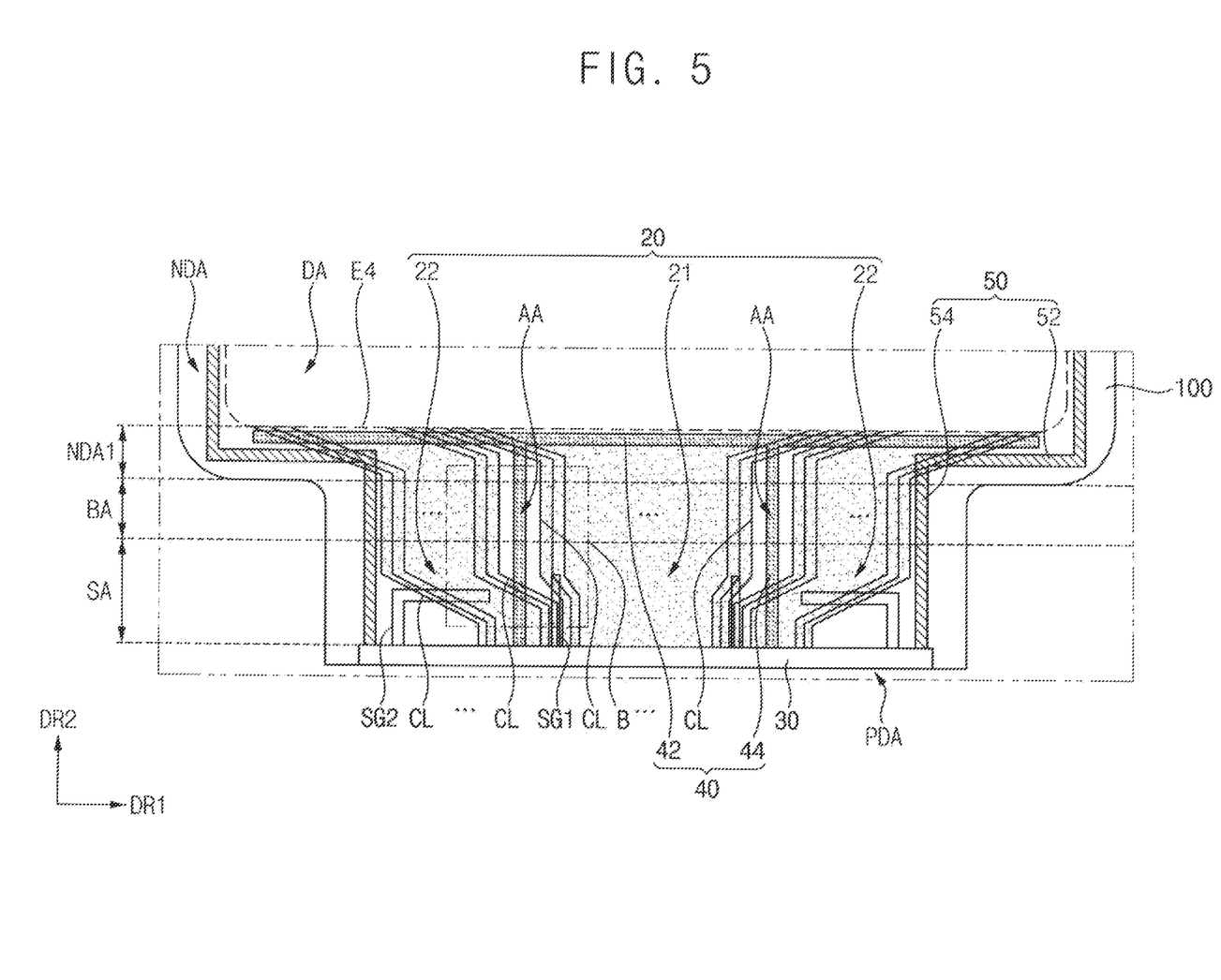
FIG. 5 is an enlarged plan view of area A of FIG. 1.
Figure 6:
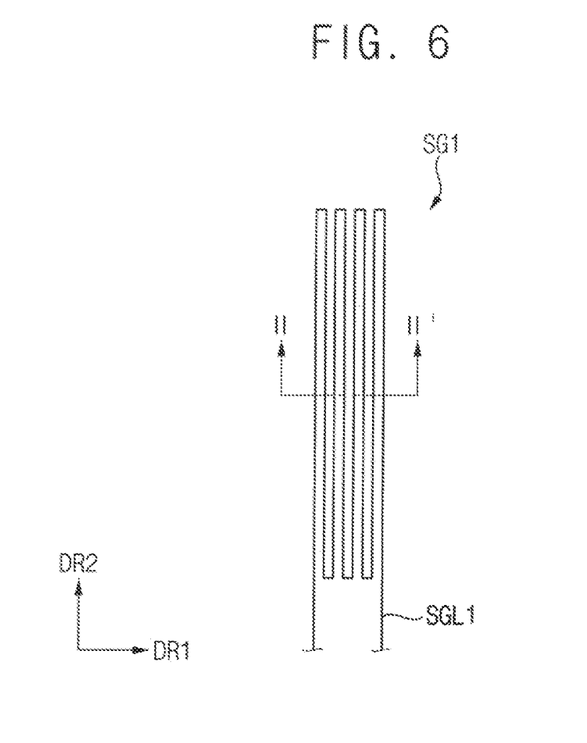
FIG. 6 is a plan view illustrating a strain gauge disposed in a first fan-out part of FIG. 5.
Figure 7:
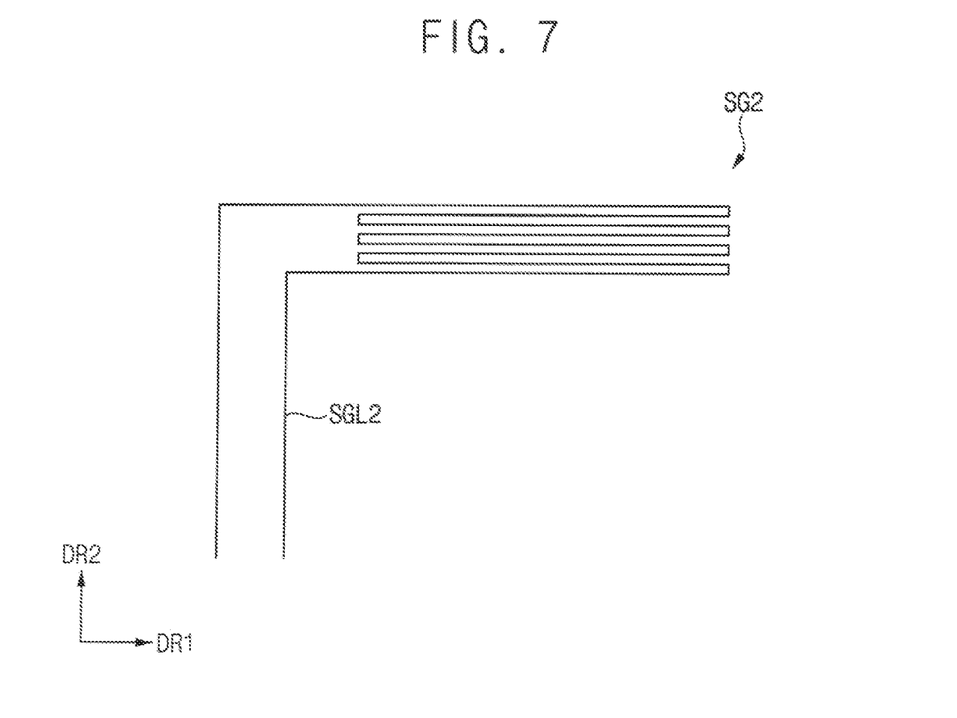
FIG. 7 is a plan view illustrating a strain gauge disposed in a second fan-out part of FIG. 5.
Figure 8:
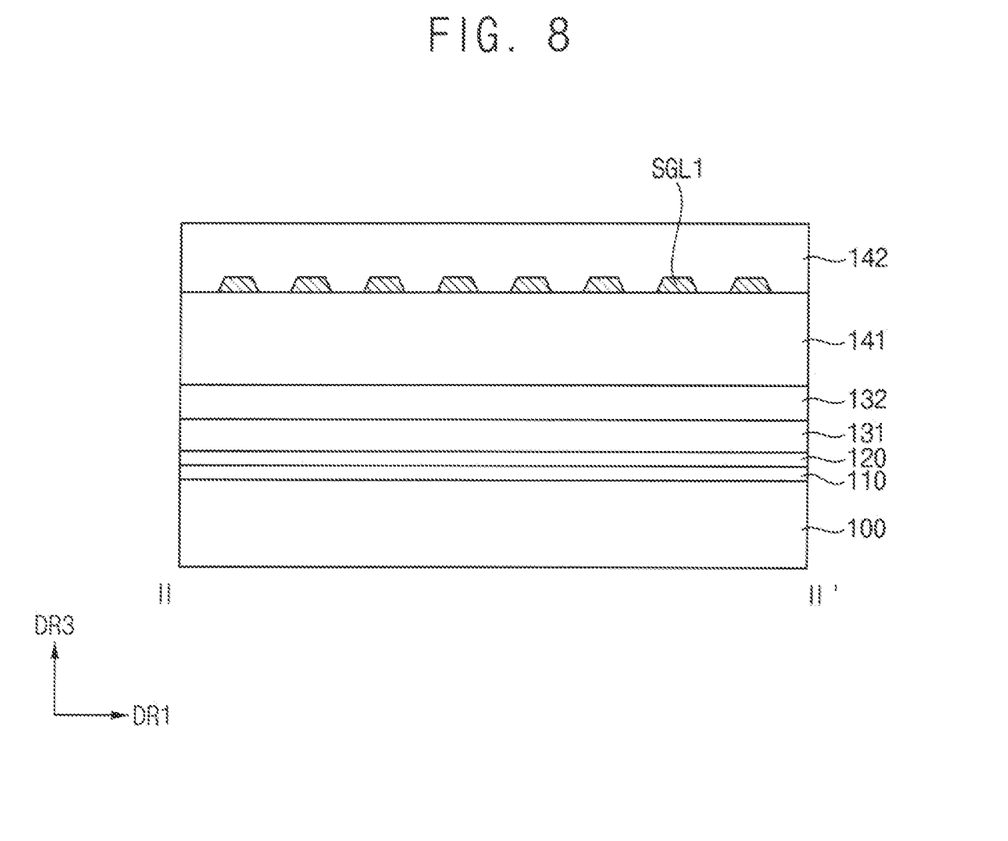
FIG. 8 is a cross-sectional view taken along line II-IF of FIG. 6.

FIG. 5 is an enlarged plan view of area A of FIG. 1. FIG. 6 is a plan view illustrating a strain gauge SG disposed in a first fan-out part 21 of FIG. 5. FIG. 7 is a plan view illustrating a strain gauge SG disposed in a second fan-out part 22 of FIG. 5. FIG. 8 is a cross-sectional view taken along line II-IF of FIG. 6.

Referring to FIG. 5 to FIG. 8, a first voltage line 40, a second voltage line 50, and the fan-out part 20 may be disposed in the non-display area NDA between the display area DA and the pad area PDA. The first voltage line 40 may be connected to the driving voltage supply line PL, and the second voltage line 50 may be connected to the common electrode 330. The second voltage line 50 may be directly connected to the common electrode 330 or may be connected to the common electrode 330 via an additional conductive layer.

The first voltage line 40 may include a first main portion 42 extending along the first direction DR1 in an area disposed close to the fourth edge E4 of the display area DA and a first connection portion 44 extending from the first main portion 42 along the second direction DR2. The first connection portion 44 may be connected to the driving circuit 30 connected to pads in the pad area PDA across the bending area BA and the surrounding area SA. That is, the first connection portion 44 may protrude from the first main portion 42 and may extend toward the pad area PDA.

The second voltage line 50 may surround the first to third edges E1, E2, and E3 of the display area DA disposed adjacent to the first voltage line 40. The second voltage line 50 may include a second main portion 52 disposed corresponding to both ends of the first main portion 42 and a second connection portion 54 extending from an end of the second main portion 52 along the second direction DR2. The second connection portion 54 may be connected to the driving circuit 30.

The fan-out part 20 may include a plurality of conductive lines CL. The conductive lines CL may be electrically connected to the data lines DL to transmit the data signal supplied from the driving circuit 30 to the pixel circuit PC.

Hereinafter, for convenience of explanation, as illustrated in FIG. 5, an area between the bending area BA and the display area DA of the non-display area NDA of the substrate 100 may be defined as a first non-display area NDA1. The surrounding area SA may be an area that is not visible from the front when the bending area BA is bent and may be an area disposed between the bending area BA and the driving circuit 30.

The conductive lines CL may be disposed to sequentially pass through the first non-display area NDA1, the bending area BA, and the surrounding area SA. Meanwhile, a length of the pad area PDA may be shorter than one side of the display area DA connected to the pad area PDA. Accordingly, a space between adjacent the conductive lines CL may be narrowed from the display area DA to the pad area PDA. The bending area BA may be an area vulnerable to stress during bending. In order to minimize damage to the conductive lines CL when bending the bending area BA, the conductive lines CL in the bending area BA may extend along a direction parallel to the bending direction in the bending area BA. For example, the conductive lines CL in the bending area BA may extend substantially perpendicular to the bending axis BAX. The conductive lines CL may not have a fan-out portion in the bending area BA but have fan-out portions in the first non-display area NDA1 and the surrounding area SA in a plan view.

Meanwhile, the fan-out part 20 may be divided into a plurality of areas spaced apart from each other at least in the surrounding area SA. As an example, as illustrated in FIG. 5, the fan-out part 20 may include a first fan-out part 21 disposed in a center of the surrounding area SA and a second fan-out part 22 disposed outside of the first fan-out part 21. However, the inventive concept is not limited thereto, and the fan-out part 20 may include a first to a fourth fan-out parts.

A separation area AA may be disposed between the first fan-out part 21 and the second fan-out part 22 in the bending area BA. The first connection portion 44 may be disposed in the separation area AA to prevent a short circuit from occurring between the first connection portion 44, the second connection portion 54, and the conductive lines CL which are disposed on a same layer. In addition, as the first connection portion 44 is disposed in the separation area AA, a current distribution through the first main portion 42 may become more uniform throughout the display area DA, and a heat generation phenomenon may be reduced. Meanwhile, although FIG. illustrates that the first connection portion 44 is disposed in the separation area AA, the second connection portion 54 may be disposed in the separation area AA. In addition, both the first is connection portion 44 and the second connection portion 54 may be disposed in the separation area AA.

A first strain gauge SG1 may be disposed in the first fan-out part 21 of the surrounding area SA. The first strain gauge SG1 may detect a strain generated along the first direction DR1 in the surrounding area SA when a stress, for example, an impact, is applied to the surrounding area SA. The first strain gauge SG1 may include a first resistance line SGL1. The first resistance line SGL1 may reciprocate a plurality of times along the second direction DR2 to form a bent portion, and may be electrically connected to the driving circuit 30. A resistance of the first resistance line SGL1 may vary depending on the degree of impact on the surrounding area SA. The first strain gauge SG1 may detect a change in resistance to sense a strain applied to the surrounding area SA, and the driving circuit 30 may measure the strain applied to the surrounding area SA.

The first resistance line SGL1 may be disposed on the first planarization insulating layer 141 and may be covered by the second planarization insulating layer 142. That is, the first resistance line SGL1 may be formed together with the driving voltage supply line PL, and may have a same structure as the driving voltage supply line PL.

A second strain gauge SG2 may be disposed in the second fan-out part 22 of the surrounding area SA. The second strain gauge SG2 may detect a strain generated along the second direction DR2 of the surrounding area SA when an impact is applied to the surrounding area SA. The second strain gauge SG2 may include a second resistance line SGL2. The second resistance line SGL2 may reciprocate a plurality of times along the first direction DR1 to form a bent portion, and may be electrically connected to the driving circuit 30. A resistance of the second resistance line SGL2 may vary depending on the degree of impact on the surrounding area SA. The second strain gauge SG2 may detect a change in resistance to sense a strain applied to the surrounding area SA, and the driving circuit 30 may measure the strain applied to the surrounding area SA.

The second resistance line SGL2 may be disposed on the first planarization insulating layer 141 and may be covered by the second planarization insulating layer 142. That is, the second resistance line SGL2 may be formed together with the driving voltage supply line PL, and may have a same structure as the driving voltage supply line PL.

Figure 9:
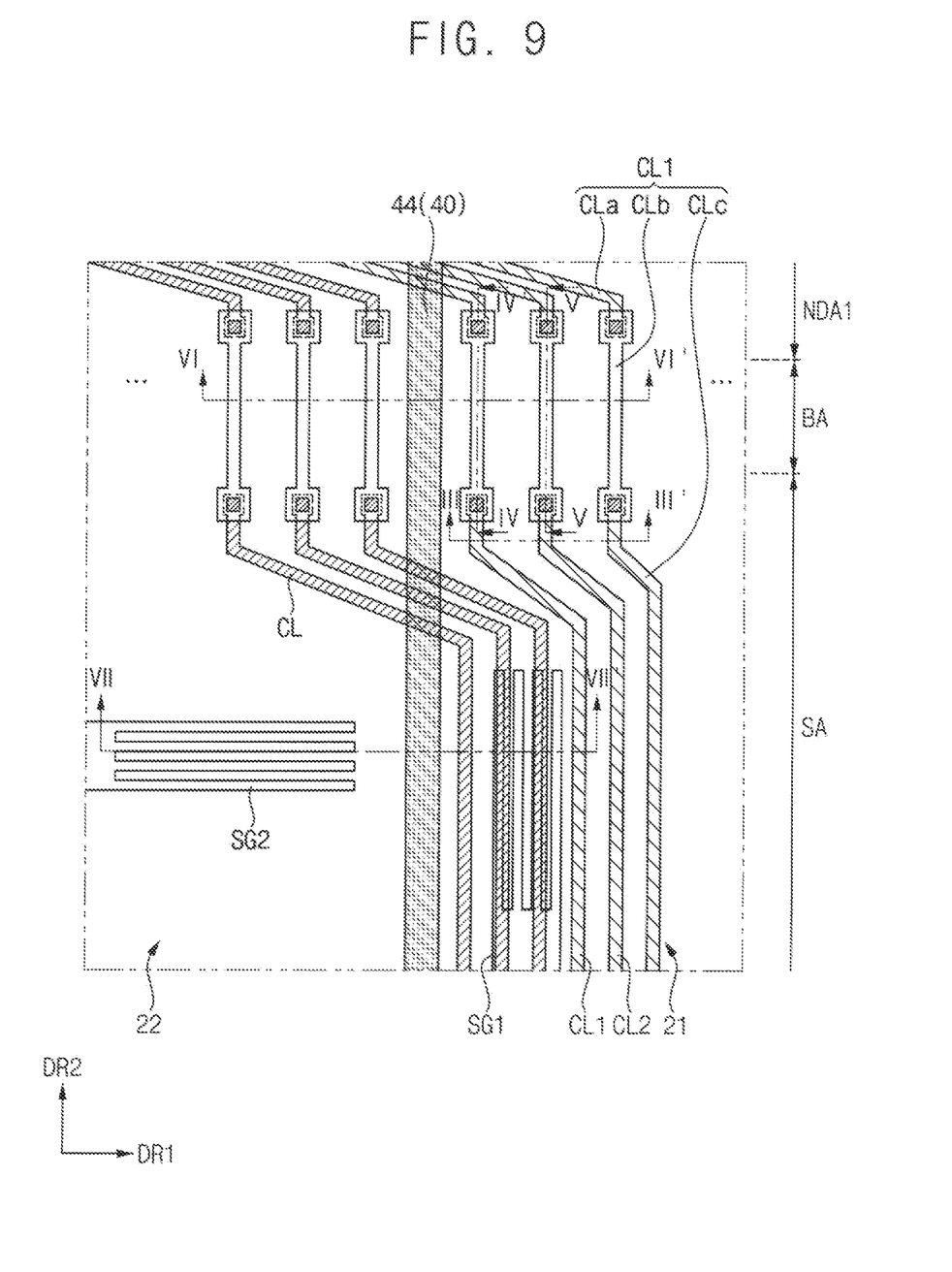
FIG. 9 is an enlarged plan view of area B of FIG. 5.
Figure 10:
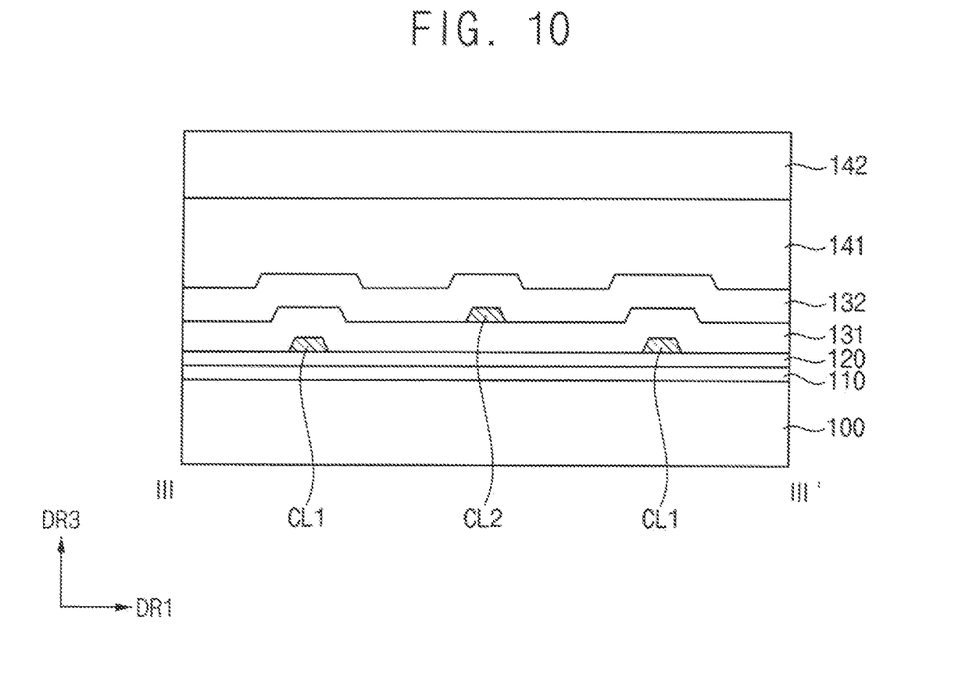
FIG. 10 is a cross-sectional view taken along line III-III' of FIG. 9.
Figure 11:
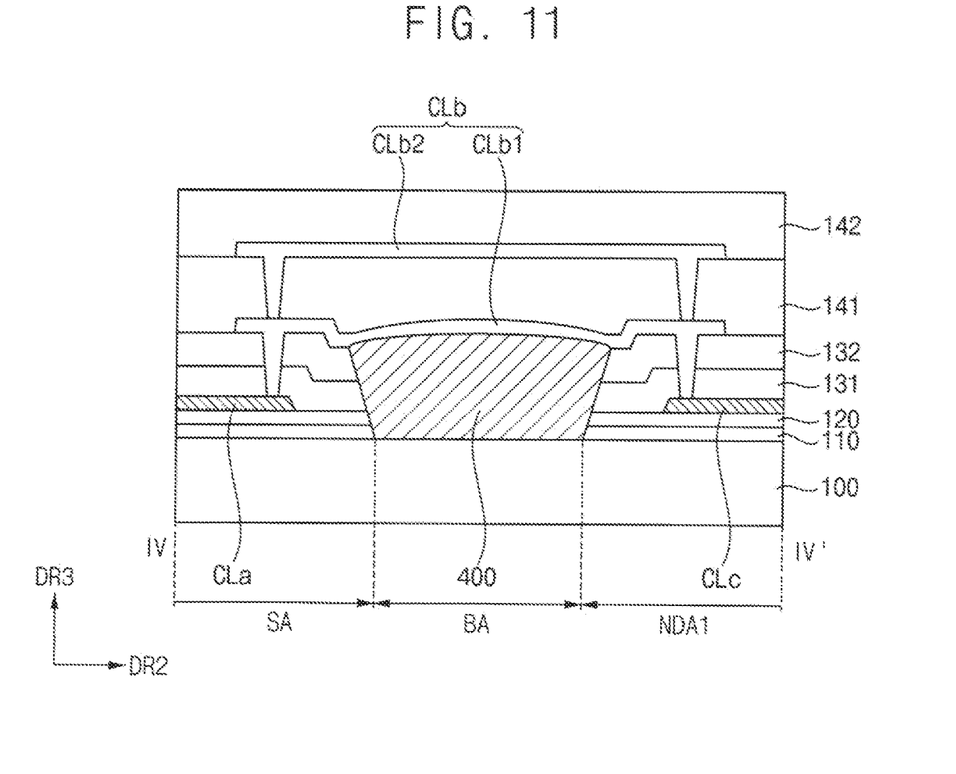
FIG. 11 is a cross-sectional view taken along line IV-IV' of FIG. 9.
Figure 12:
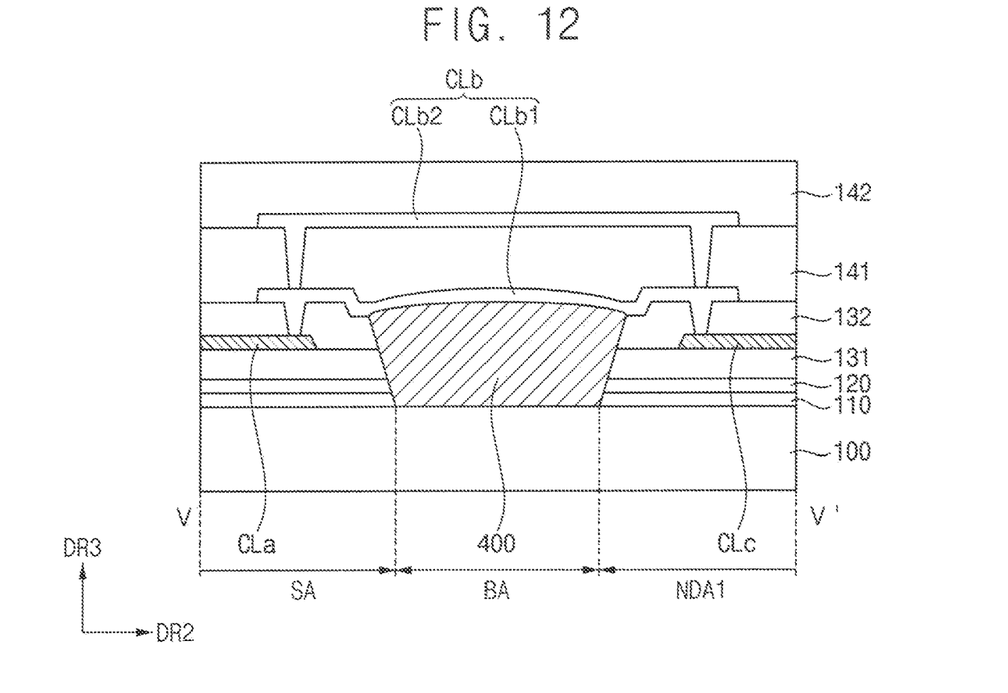
FIG. 12 is a cross-sectional view taken along line V-V' of FIG. 9.
Figure 13:
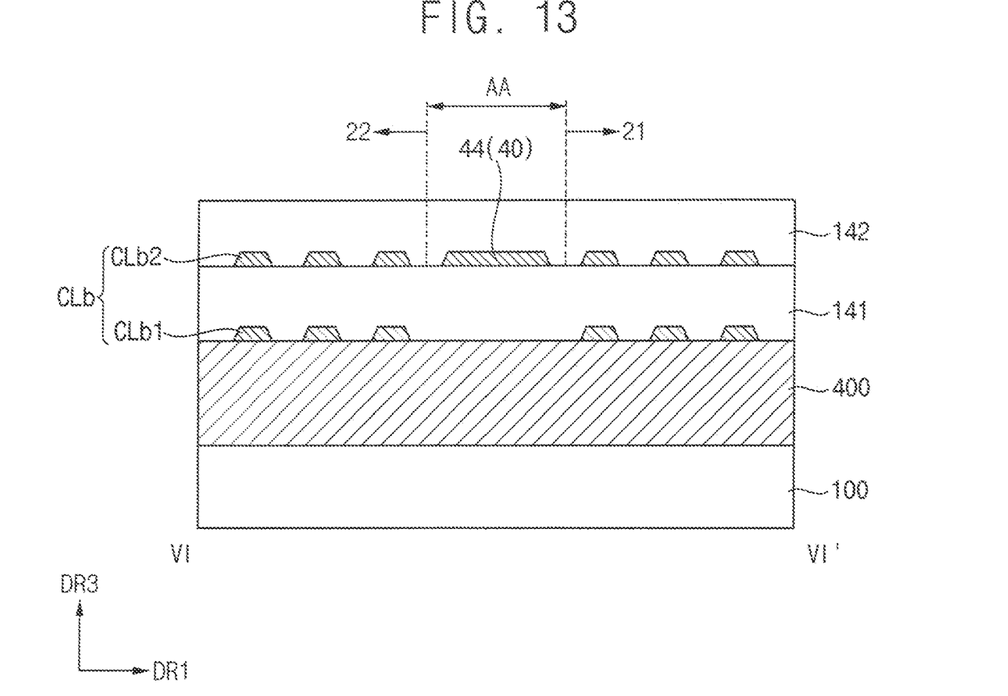
FIG. 13 is a cross-sectional view taken along line VI-VI' of FIG. 9.

FIG. 9 is an enlarged plan view of area B of FIG. 5. FIG. 10 is a cross-sectional view taken along line III-III' of FIG. 9. FIG. 11 is a cross-sectional view taken along line IV-IV' of FIG. 9. FIG. 12 is a cross-sectional view taken along line V-V' of FIG. 9. FIG. 13 is a cross-sectional view taken along line VI-VI' of FIG. 9.

Referring to FIGS. 9 to 12, each of the first fan-out part 21 and the second fan-out part 22 may include the plurality of conductive lines CL. Meanwhile, as a resolution of the display device 1 increases, the number of necessary conductive lines CL per unit area is increasing. Accordingly, a space between adjacent conductive lines CL may be reduced. As a result, a risk of occurrence of the short circuit between the adjacent conductive lines CL may increase. Accordingly, the above problem may be solved by including first conductive lines CL1 and second conductive lines CL2 disposed at different heights of the conductive lines CL. Here, the difference in height means that the distance from the substrate 100 is different.

As illustrated in FIG. 10, the first conductive lines CL1 may be disposed on the gate insulating layer 120. The second conductive lines CL2 may be disposed on the first interlayer insulating layer 131. The first conductive line CL1 and the second conductive line CL2 may be alternately disposed with each other. Accordingly, even if the spacing between the first and the second conductive lines CL1 and CL2 decreases in a plan view, the occurrence of the short circuit between the first conductive line CL1 and the second conductive line CL2 may be prevented.

More specifically, each of the conductive lines CL may include a first conductive layer CLa disposed in the first non-display area NDA1, a second conductive layer CLc disposed in the surrounding area SA, and a connection conductive layer CLb electrically connecting the first conductive layer CLa and the second conductive layer CLc. That is, the first conductive layer CLa may be disposed between the display area DA and the bending area BA. The connection conductive layer CLb may be disposed to cross the bending area BA. The adjacent first conductive line CL1 and second conductive line CL2 have different heights from each other means that the first conductive layer CLa of the first conductive lines CL1 and the first conductive layer CLa of the second conductive lines CL2 are disposed on different layers. In addition, the second conductive layer CLc of the first conductive lines CL1 and the second conductive layer CLc of the second conductive lines CL2 may be disposed on different layers. In contrast, the connection conductive layer CLb crossing the bending area BA may be disposed at the same height in the first conductive line CL1 and the second conductive line CL2.

For example, FIG. 11 illustrates the first conductive layer CLa and the second conductive layer CLc disposed on the gate insulating layer 120 and the first conductive line CL1 connected by the connection conductive layer CLb. FIG. 12 illustrates the first conductive layer CLa and the second conductive layer CLc disposed on the first interlayer insulating layer 131 and the second conductive line CL2 connected by the connection conductive layer CLb.

The connection conductive layer CLb may be formed longer than the bending area BA so that contact points with the first conductive layer CLa and the second conductive layer CLc are respectively disposed in the first non-display area NDA1 and the surrounding area SA.

The connection conductive layer CLb may include a first connection conductive layer CLb1 and a second connection conductive layer CLb2 that are connected in parallel to each other between the first conductive layer CLa and the second conductive layer CLc, and overlap each other in a plan view. Therefore, even if the first connection conductive layer CLb1 or the second connection conductive layer CLb2 may be damaged by the stress applied to the bending area BA, an open circuit between the first conductive layer CLa and the second conductive layer CLc may be prevented.

The first connection conductive layer CLb1 may be disposed on the second interlayer insulating layer 132, and the second connection conductive layer CLb2 may be disposed on the first planarization insulating layer 141. That is, the first connection conductive layer CLb1 may be formed together with the data line DL to have a same structure as the data line DL. The second connection conductive layer CLb2 may be formed together with the driving voltage supply line PL to have a same structure as the driving voltage supply line PL. The second connection conductive layer CLb2 may be disposed on a same layer as the strain gauge SG.

As illustrated in FIG. 11, the bending area BA may be an area from which to a part of the buffer layer 110, the gate insulating layer 120, the first interlayer insulating layer 131, and the second interlayer insulating layer 132 on the substrate 100 have been removed. Hereinafter, the buffer layer 110, the gate insulating layer 120, the first interlayer insulating layer 131, and the second interlayer insulating layer 132 are collectively referred to as an inorganic insulating layer. That is, it may be understood that the inorganic insulating layer stacked on the substrate 100 includes a groove at a position corresponding to the bending area BA. By removing the part of the inorganic insulating layer from the bending area BA, it is possible to facilitate bending in the bending area BA and prevent cracks or the like from occurring in the inorganic insulating layer during bending.

An organic material layer 400 may be filled in the part from which the inorganic insulating layer has been removed. The organic material layer 400 may extend from the bending area BA to the first non-display area NDA1 and the surrounding area SA adjacent to the bending area BA. The organic material layer 400 not only compensates for a step difference in the bending area BA from which the inorganic insulating layer is removed, but also absorbs stress generated by bending. Accordingly, it is possible to effectively minimize the concentration of stress generated during bending in the connection conductive layer CLb disposed on the bending area BA to transmit an electrical signal from the driving circuit 30 disposed in the pad area PDA to the display area DA.

Examples of the organic material layer 400 include acrylic, methacryl, polyester, polyethylene, polypropylene, polyethylene terephthalate, polyethylene naphthalate, polycarbonate, polyimide, polyethylene sulfonate, polyoxymethylene, polyarylate, hexamethyl disiloxane. These may be used alone or in combination with each other.

Meanwhile, although not illustrated in the drawing, the pixel defining to layer 150 may be disposed on the second planarization insulating layer 142 in the bending area BA. A bending protection layer may be further disposed on the pixel defining layer 150.

Referring to FIGS. 9 and 13, the first connection portion 44 may be disposed between the first fan-out part 21 and the second fan-out part 22 in the bending area BA. A width of the first connection portion 44 may be greater than a width of the conductive lines CL.

The first connection portion 44 may cross the bending area BA and may be disposed on the first planarization insulating layer 141. The first connection portion 44 may also be disposed on the first planarization insulating layer 141 in the first non-display area NDA1 and the surrounding area SA. Therefore, in the bending area BA, since the first connection portion 44 is disposed on a same layer as the second connection conductive layer CLb2, the first connection portion 44 may be spaced apart from the second connection conductive layer CLb2. However, in the first non-display area NDA1 and the surrounding area SA, since the first conductive layer CLa and the second conductive layer CLc are disposed on different layers from the first connection portion 44, the first connection portion 44 may be disposed to overlap the first and the second conductive layers CLa and CLc in a vertical direction.

In order to prevent the open circuit between the first conductive layer CLa and the second conductive layer CLc, the connection conductive layer CLb may include the first connection conductive layer CLb1 and the second connection conductive layer CLb2 connected in parallel. On the other hand, since the width of the first connection portion 44 is larger than the width of the connection conductive layer CLb, there is less possibility that a disconnection occurs in the first connection portion 44 compared to the connection conductive layer CLb. Therefore, the first connection portion 44 may be disposed only on the first planarization insulating layer 141. In other words, the first connection portion 44 may not be arranged in parallel.

The first connection portion 44 may be disposed in the separation area AA between the first fan-out part 21 and the second fan-out part 22. That is, since the first connection portion 44 is disposed between the conductive lines CL, the first connection portion 44 may be disposed close to a center of the surrounding area SA. Accordingly, the first strain gauge SG1 may be disposed close to the center of the surrounding area SA. The first strain gauge SG1 may measure the strain generated in the center close to the driving circuit 30.

Figure 14:
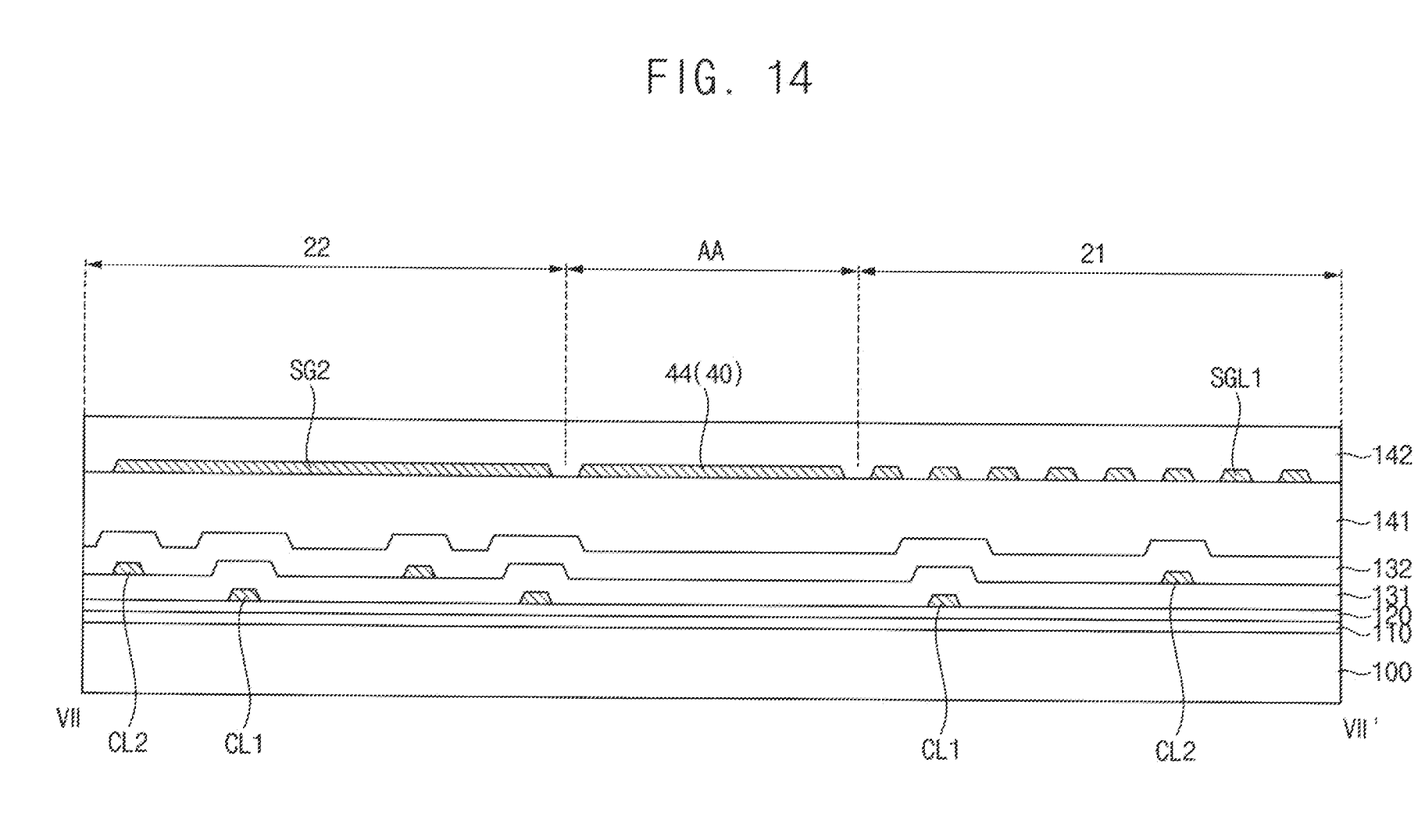
FIG. 14 is a cross-sectional view taken along line VII-VII' of FIG. 9.

FIG. 14 is a cross-sectional view taken along line VII-VII' of FIG. 9.

Referring to FIG. 14, the first connection portion 44 may be disposed between the first fan-out part 21 and the second fan-out part 22. The width of the first connection portion 44 may be greater than the width of the conductive lines CL.

The first fan-out part 21 includes the plurality of conductive lines CL, and the conductive lines CL may include the first conductive line CL1 and the second conductive line CL2 disposed at different heights. The first strain gauge SG1 disposed on the first fan-out part 21 may be disposed on the first planarization insulating layer 141.

The second fan-out part 22 includes the plurality of conductive lines CL, and the conductive lines CL may include the first conductive lines CL1 and the second conductive line CL2 disposed at different heights. The second strain gauge SG2 disposed on the second fan-out part 22 may be disposed on the first planarization insulating layer 141.

The first connection portion 44 may be disposed in the separation area AA between the first fan-out part 21 and the second fan-out part 22. The first connection portion 44 may be disposed on the first planarization insulating layer 141.

In other words, the first connection portion 44, the first strain gauge SG1, and the second strain gauge SG2 may be disposed on a same layer. In more detail, the first connection portion 44, the first strain gauge SG1, and the second strain gauge SG2 may include same material and may be formed at same time.

The first connection portion 44, the first strain gauge SG1, and the second strain gauge SG2 may be disposed on a same layer as the driving voltage supply line PL and the second connection metal CM2. Accordingly, the first connection portion 44, the first strain gauge SG1, the second strain gauge SG2, the driving voltage supply line PL, and the second connection metal CM2 may include same material and may be formed at same time. In other words, an additional process may not be required to form the first and the second strain gauges SG1 and SG2.

For example, when an impact is applied to the surrounding area SA during the manufacturing process of the display device 1, the strain may increase locally due to the impact on the surrounding area SA. Accordingly, a possibility of defects such as disconnection occurring in the connection conductive layer CLb may increase. However, such an increase in strain is difficult to detect, and it was difficult to grasp such an increase in strain before actual failure occurs. However, the strain applied to the first direction DR1 and the second direction DR2 of the surrounding area SA may be more accurately measured by the first strain gauge SG1 and the second strain gauge SG2. Accordingly, it is possible to determine whether there is a possibility of defect to the display device 1 by determining whether the strain applied to the surrounding area SA reaches the threshold value of the connection conductive layer CLb. Accordingly, the reliability of the display device 1 may be improved.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate including a display area and a non-display area surrounding the display area, the non-display area including a pad area, a bending area disposed between the display area and the pad area, and a surrounding area disposed between the pad area and the bending area;
   a fan-out part disposed on the non-display area on the substrate and including a plurality of conductive lines that connects signal lines in the display area and pads in the pad area; and
   a strain gauge disposed on the substrate in the surrounding area,
   wherein the strain gauge detects a strain generated when stress is applied to the surrounding area.

2. The display device of claim 1, further comprising:
a voltage line disposed on the substrate and including a main portion disposed between the display area and the bending area and a connection portion extending from the main portion toward the pad area and crossing the bending area.

3. The display device of claim 2, wherein the connection portion is disposed on a same layer as the strain gauge.

4. The display device of claim 2, wherein the fan-out part includes a first fan-out part and a second fan-out part spaced apart from each other and disposed in the surrounding area,
wherein the first fan-out part is disposed in a center of the surrounding area,
wherein the second fan-out part is disposed in a side of the surrounding area, and
wherein the connection portion is disposed between the first fan-out part and the second fan-out part in the bending area.

5. The display device of claim 4, wherein the strain gauge is disposed in the first fan-out part.

6. The display device of claim 5, wherein the strain gauge extends along a direction parallel to the connection portion.

7. The display device of claim 6, further comprising a strain gauge disposed in the second fan-out part,
wherein the strain gauge in the second fan-out part extends along a direction perpendicular to the connection portion.

8. The display device of claim 4, wherein the strain gauge is disposed in the second fan-out part.

9. The display device of claim 8, wherein the strain gauge extends in a direction parallel to the main portion.

10. The display device of claim 1, wherein each of the conductive lines includes a first conductive layer disposed between the display area and the bending area, a second conductive layer disposed in the surrounding area, and a connection conductive layer electrically connecting the first conductive layer and the second conductive layer and crossing the bending area, and
wherein the connection conductive layer includes a first connection conductive layer and a second connection conductive layer that are connected in parallel to each other and overlap each other in a plan view.

11. The display device of claim 10, wherein the first conductive layer and the second conductive layer are disposed on a same layer, and
wherein the connection conductive layer is disposed on a different layer from the first conductive layer.

12. The display device of claim 11, wherein the second connection conductive layer is disposed on the first connection conductive layer, and
wherein the second connection conductive layer is disposed on a same layer as the strain gauge.

13. The display device of claim 10, wherein a plurality of pixel circuits, a plurality of light emitting elements electrically connected to the pixel circuits, and a plurality of data lines electrically connected to the pixel circuits are disposed in the display area,
wherein the conductive lines are electrically connected to the data lines to transmit an electrical signal supplied from a driving circuit disposed in the pad area to the data lines, and
wherein the first connection conductive layer is disposed on a same layer as the data lines.

14. The display device of claim 13, further comprising a plurality of driving voltage supply lines which provide a plurality of driving signals to the pixel circuits in the display area, and
wherein the strain gauge is disposed on a same layer as the driving voltage supply lines.

15. The display device of claim 14, wherein the strain gauge and the driving voltage supply lines include a same material.

16. The display device of claim 1, wherein the strain gauge includes a resistance line which reciprocates a predetermined distance a plurality of times, and
wherein the resistance line is electrically connected to a driving circuit disposed in the pad area.

17. A display device comprising:
a substrate including a display area and a non-display area surrounding the display area, the non-display area including a pad area, a bending area disposed between the display area and the pad area, and a surrounding area disposed between the pad area and the bending area;
a fan-out part disposed on the non-display area on the substrate and including a first fan-out part disposed in a center of the surrounding area and a second fan-out part disposed in a side of the surrounding area; and
a strain gauge including a first strain gauge disposed in the first fan-out part and a second strain gauge disposed in the second fan-out part,
wherein the strain gauge detects a strain generated when stress is applied to the fan-out part.

18. The display device of claim 17, wherein the first strain gauge and the second strain gauge are disposed on a same layer.

19. The display device of claim 17, wherein the first strain gauge extends from the surrounding area toward the bending area, and
wherein the second strain gauge extends in a direction perpendicular to the first strain gauge.

* * * * *